United States Patent
Jimenez De Parga Bernal

(10) Patent No.: US 10,756,779 B1
(45) Date of Patent: Aug. 25, 2020

(54) METHOD AND SYSTEM FOR POWER LINE COMMUNICATION COUPLING AND ZERO CROSS DETECTOR COMBINATION

(71) Applicant: Maxlinear, Inc., Carlsbad, CA (US)

(72) Inventor: Antonio Jimenez De Parga Bernal, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 16/279,454

(22) Filed: Feb. 19, 2019

Related U.S. Application Data

(60) Provisional application No. 62/632,194, filed on Feb. 19, 2018.

(51) Int. Cl.
*H04B 3/54* (2006.01)
*G01R 19/175* (2006.01)
*H04B 1/10* (2006.01)
*H02M 1/44* (2007.01)

(52) U.S. Cl.
CPC ............ *H04B 3/54* (2013.01); *G01R 19/175* (2013.01); *H04B 1/1018* (2013.01); *H02M 1/44* (2013.01)

(58) Field of Classification Search
USPC ........................................................ 375/257
See application file for complete search history.

(56) References Cited

U.S. PATENT DOCUMENTS

| | | | |
|---|---|---|---|
| 2006/0262478 A1* | 11/2006 | Chaudhry | H04M 1/745 361/119 |
| 2011/0235758 A1* | 9/2011 | Khoini-Poorfard | H03G 3/001 375/345 |
| 2012/0146538 A1* | 6/2012 | Nerone | H05B 33/0815 315/291 |
| 2017/0318623 A1* | 11/2017 | Duffy | H04W 36/14 |
| 2018/0130618 A1* | 5/2018 | Ramirez | H01H 9/56 |
| 2018/0276980 A1* | 9/2018 | Yukizane | G08B 17/00 |

* cited by examiner

*Primary Examiner* — Lihong Yu
(74) *Attorney, Agent, or Firm* — Maschoff Brennan

(57) ABSTRACT

Methods and systems are disclosed for MIMO power line communication signal coupling combined with zero cross detector analog front end and may include a circuit for powerline communication including a coupling circuit and zero cross detector, where both are coupled to an input transformer that receives an alternating current (AC) power signal and radio frequency (RF) signals from line and neutral power lines via input capacitors. The coupling circuit may include a plurality of powerline communication receivers, a that receives a first RF signal via a secondary coil of the input transformer and a second that receives a second RF signal via a center terminal of a capacitor pair coupled to primary coils of the input transformer. The second receiver may comprise a second transformer. A center tap of the second transformer may be coupled to ground via an inductor. A third receiver may generate a third RF signal via the inductor.

20 Claims, 16 Drawing Sheets

METHOD AND SYSTEM FOR POWER LINE COMMUNICATION COUPLING AND ZERO CROSS DETECTOR COMBINATION

CLAIM OF PRIORITY

This patent application makes reference to, claims priority to and claims benefit from the U.S. Provisional Patent Application Ser. No. 62/632,194, filed on Feb. 19, 2018, which is hereby incorporated herein by reference in its entirety.

TECHNICAL FIELD

Certain embodiments of the invention relate to wired communication. More specifically, certain embodiments of the invention relate to a method and a system for power line communication coupling and zero cross detector combination.

BACKGROUND

Communication via wired connections may comprise reception and/or transmission of radio frequency (RF) signals. In this regard, communication devices may transmit and/or receive RF signals carrying exchanged data, with the RF signals being configured in accordance with corresponding wired and/or wireless protocols or standards. Accordingly, signal processing (e.g., of RF signals) must be performed during wireless and/or wired communications to enable proper exchange of information. Exemplary signal processing operations may comprise filtering, amplification, up-convert/down-convert baseband signals, analog-to-digital and/or digital-to-analog conversion, encoding/decoding, encryption/decryption, and/or modulation/demodulation.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method is provided for MIMO power line communication signal coupling combined with zero cross detector analog front end, substantially as shown in and/or described in connection with at least one of the figures, as set forth more completely in the claims.

These and various other advantages, aspects and novel features of the present invention, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
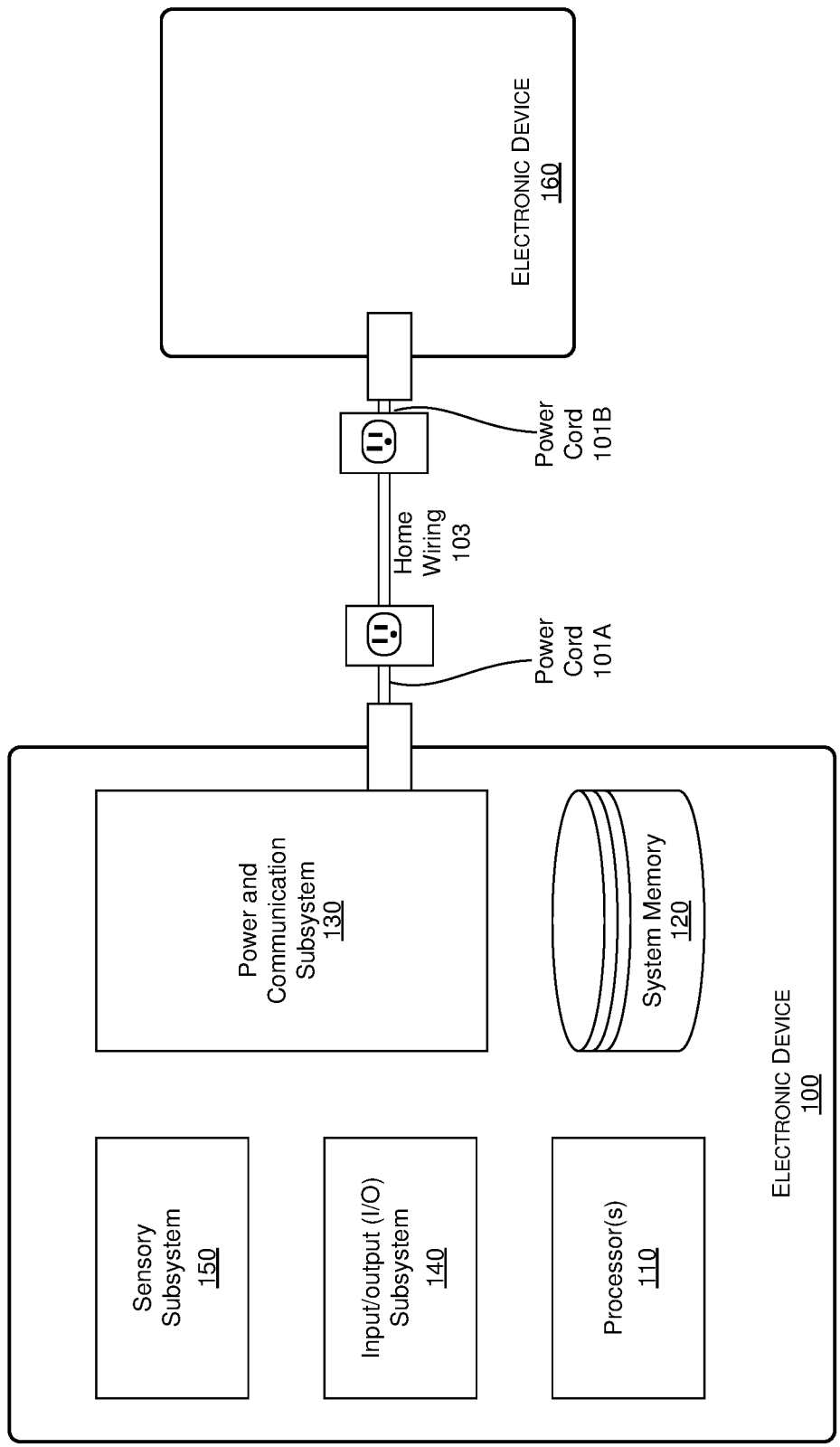
FIG. 1 illustrates an example electronic device that utilizes power line communication, which may be used in accordance with various implementations of the disclosure.

FIG. 1 illustrates an example electronic device that utilizes power line communication, which may be used in accordance with various implementations of the disclosure. Referring to FIG. 1, there is shown an electronic device 100 and an electronic device 160. The electronic device 160 may be substantially similar to the electronic device 100, but shown without the detail shown for electronic device 100 for figure clarity, and shows the connection of the devices via their respective power cords 101A/101B and home wiring 103.

The electronic device 100 may comprise suitable circuitry, interfaces, logic, and/or code for implementing various aspects of the inventions. In this regard, the electronic device 100 the electronic device may be configured to support performing, executing or running various operations, functions, applications and/or services. For example, the electronic device 100 may be operable to support, in some instances, such operations as communication operations, processing or handling of data, input/output operations, or the like. In this regard, the electronic device 100 may enable and/or support communication of data, such as via wired connections, which may be configured in accordance with one or more supported wireless and/or wired protocols or standards.

An example wired communications technology is power line communication (PLC), which enables sending data over existing power cables. In this manner, the power cords, such as the power cords 101A and 101B and home wiring 103, that connect to the electronic devices 100 and 150 can both power them up and at the same time control/retrieve data from it in a half-duplex manner. There are two variations of PLC: a narrowband PLC, which works at lower frequencies (3-500 kHz), with lower data rates (up to 100s of kbps), and with longer range (up to several kilometers); and a broadband PLC, which works at higher frequencies (1.8-250 MHz), with high data rates (up to 100s of Mbps) and is used in shorter-range applications. PLC can operate with either AC-PLC solutions or DC-PLC. For AC-PLC, the desired communication signal is separated from the 50/60 Hz AC power signal. Coupling circuitry for PLC may comprise a passive network located between the AC supply input (line, neutral, ground) and PLC signal extraction/integration circuitry.

Examples of electronic devices may comprise a PLC network box, set-top boxes, televisions, displays, gateways, modems, access points, femtocells, computers, smartphones, tablets, and or any other network node. The disclosure, however, is not limited to any particular type of electronic device.

The electronic device 100 may comprise, for example, one or more processors 110, a system memory 120, a communication subsystem 130, an input/output (I/O) subsystem 140, and a sensory subsystem 150.

The processor 110 may comprise suitable circuitry, interfaces, logic, and/or code that may be operable to perform general and/or specialized processing operations in the electronic device 110. For example, the processor 110 may comprise a general purpose processor (e.g., a central processing unit or CPU), a special purpose processor (e.g., graphics processing unit or GPU, or a visual processing unit or VPU), or the like. The disclosure, however, is not limited to any particular type of processor. When utilized as a general purpose processor, the processor 110 may be operable to, for example, process or handle data, control or manage operations of the electronic device 100, and/or handle or support tasks and/or applications performed therein. In this regard, the processor 110 may be utilized to configure and/or control operations of various components and/or subsystems of the electronic device 100, by utilizing, for example, one or more control signals. In some instances, however, the processor 110 may comprise a specialized processor, such as a video/graphics processor or a dedicated application processor that may be utilized for running and/or executing applications (or programs) in the electronic device 100.

The system memory 120 may comprise suitable circuitry, interfaces, logic, and/or code that may enable permanent and/or non-permanent storage, buffering, and/or fetching of data, code and/or other information, which may be used, consumed and/or processed. In this regard, the system memory 120 may comprise different memory technologies, including, for example, read-only memory (ROM), random access memory (RAM), Flash memory, solid-state drive (SSD), and/or field-programmable gate array (FPGA). The disclosure, however, is not limited to any particular type of memory or storage device. The system memory 120 may store, for example, configuration data, which may comprise parameters and/or code, comprising software and/or firmware. The disclosure is not limited, however, to any particular type of configuration data.

The power and communication subsystem 130 may comprise suitable circuitry, interfaces, logic, and/or code operable to communicate data from and/or to the electronic device, such as via one or more wired connections. The communication subsystem 130 may be configured to support one or more wired protocols and/or interfaces, facilitating transmission and/or reception of signals to and/or from the electronic device 100 and/or processing of transmitted or received signals in accordance with applicable wired protocols. Examples of PLC protocols and/or interfaces that may be supported and/or used by the communication subsystem 130 comprise G.hn, G3-PLC, Prime, IEEE P1901.2, ANSI/EIA 709.1.2, KNX, and IEC61334. Examples of signal processing operations that may be performed by the communication subsystem 130 comprise, for example, filtering, amplification, analog-to-digital conversion and/or digital-to-analog conversion, processing of baseband signals to isolate MIMO streams, encoding/decoding, encryption/decryption, and/or modulation/demodulation.

The power and communication subsystem 130 may be operable to receive AC power via the power cord 101A, for example, where the received AC signal also comprises a communication signal. The power and communication subsystem 130 may extract the communication signal from the received AC signal while also utilizing the 50/60 Hz AC signal to power the electronic device 100. The power and communication subsystem may downscale the AC voltage to obtain a time reference from the zero crossing point. Accordingly, the power and communication subsystem 130 may comprise filtering and rectifying circuitry for providing DC voltages for powering various circuitry in the electronic device 100.

The I/O subsystem 140 may comprise suitable circuitry, interfaces, logic, and/or code for enabling and/or managing user (e.g., end-user or installer) interactions with the electronic device 100, such as obtaining input from, and/or to providing output to, the device user(s). The I/O subsystem 140 may support various types of inputs and/or outputs, including, for example, video, audio, and/or text. In this regard, dedicated I/O devices and/or components, external to (and coupled with) or integrated within the electronic device 100, may be utilized for inputting and/or outputting data during operations of the I/O subsystem 140. Examples of such dedicated I/O devices may comprise displays, audio I/O components (e.g., speakers and/or microphones), mice, keyboards, touch screens (or touchpads), and the like. In some instances, user input obtained via the I/O subsystem 140, may be used to configure and/or modify various functions of particular components or subsystems of the electronic device 100.

The sensory subsystem 150 may comprise suitable circuitry, interfaces, logic, and/or code for obtaining and/or generating sensory information, which may relate to the electronic device 100, its user(s), and/or its environment. For example, the sensory subsystem 150 may comprise ambient conditions (e.g., temperature, humidity, or light) sensors, positional or location sensors (e.g., GPS or other GNSS based sensors), and/or motion related sensors (e.g., accelerometer, gyroscope, pedometers, and/or altimeters).

In operation, the electronic device 100 may be utilized (e.g., by a user) to perform, execute and/or run various operations, functions, applications or services, such as using pre-configured instructions and/or based on real-time user instructions or interactions. In this regard, various types of operations, functions, applications or services may be available in or supported by the electronic device 100. For example, the electronic device 100 may be used for executing programs, playing video and/or audio content, gaming, email applications (and/or similar type of web based communications), calling services (e.g., voice calls), networking services), or the like. The disclosure, however, is not limited to any particular type of operations, functions, applications or services.

In some instances, operations performed by the electronic device 100 may sometimes require generation of signals with particular characteristics, such as frequencies. For example, the electronic device 100 may be utilized in communication of data, such as using available wired connections. In this regard, data may be communicated using radio frequency (RF) signals, which may be communicated to and/or from the electronic device 100 over supported wired interfaces. Processing signals in the electronic device 100 may be performed using suitable components or circuits (e.g., in the communication subsystem 130), in which signals may be generated for use as baseband signals for example. The electronic device 100 may also be utilized in generating audio signals (e.g., for output via speakers), such as based on digital audio content obtained from local sources (storage media), remote sources (e.g., broadcast nodes), or user input (e.g., clicks corresponding to interactions with touchscreen).

The electronic device 100 is operable to communicate using PLC technology, which therefore utilizes circuitry for separating communication signals from the AC power signal. PLC modems typically utilize one circuit to couple the PLC signal to the AC line and another circuit to sense the 50/60 Hz AC reference. The coupling circuit is typically a high frequency transformer with series capacitors that couples the PLC signal differentially between AC lines. The AC sensing circuit (a.k.a. zero cross detector) is typically an optocoupler. The G.hn protocol requires higher precision, so a capacitor divider and a comparator may be used in that application. For a MIMO PLC device, the number of connections between primary AC and secondary is high: 2 for power supply, 4 for PLC signal coupling and 2 for the zero cross detector. The combination of coupling and a zero cross detector reduces the bill of materials and simplifies the interconnection, reducing the potential for undesired noise loops.

The circuitry combines a 3-channel multiple-input multiple-output (MIMO) PLC coupling circuit and a zero cross detector interface. The PLC circuitry in the power and communication subsystem 130 may utilize the same Y1 capacitors, such as C1 in FIG. 3, for PLC signal coupling and for AC voltage downscaling, reducing the part count and the number of connections to the AC side. PLC coupling circuitry may allow using MIMO 3×2 (3 receivers and 2 transmitters). The method used to receive the signal of the third channel may be different from classical differential coupling. A third MIMO mode may comprise a common-mode PLC signal. The PLC circuitry may use an inductor in combination with the stray capacitance to ground and a high pass filter. The inductor used for the $3^{rd}$ channel receiver may also set the AC level of the ground plane of the device and prevents noise pickup in the PLC receiver. This is illustrated further in FIGS. 2-11.

Figure 2A:
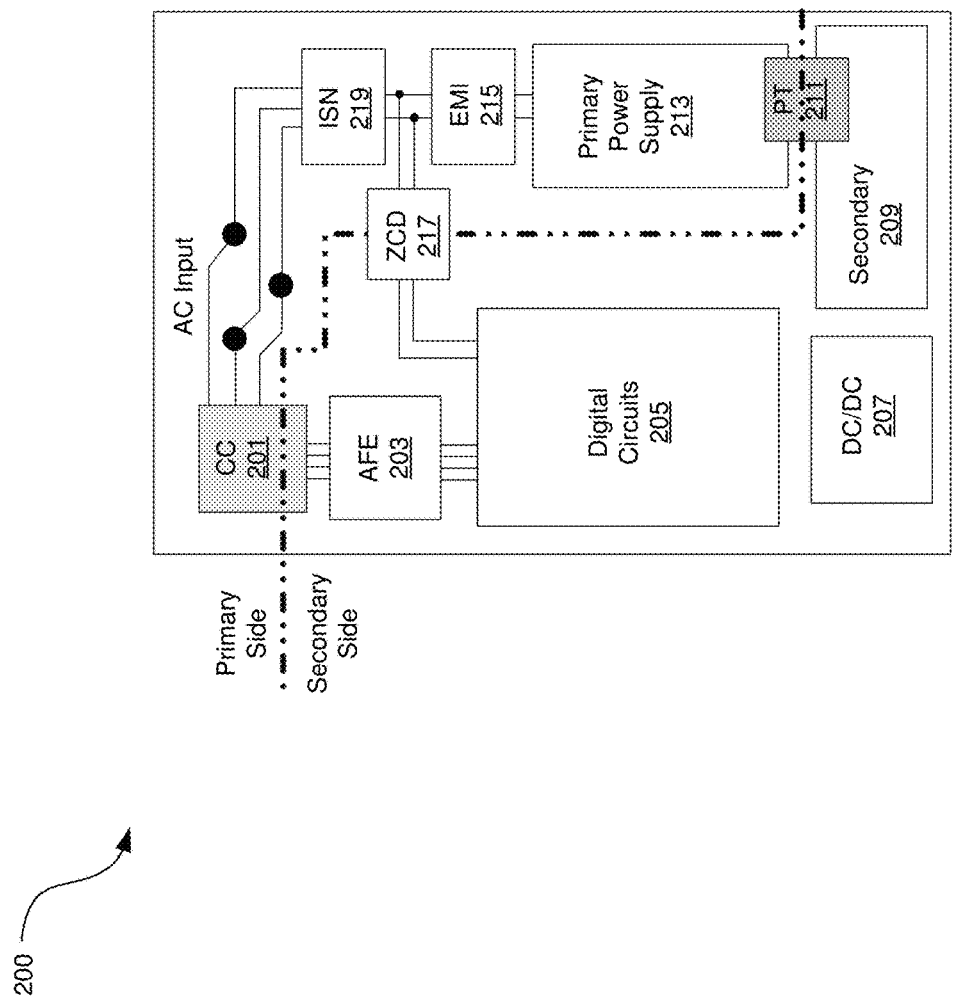
FIG. 2A is a block diagram illustrating an example primary-secondary connection in a power line communication system, which may be used in accordance with various implementations of the disclosure.

FIG. 2A is a block diagram illustrating an example primary-secondary connection in a power line communication system, which may be used in accordance with various implementations of the disclosure. Referring to FIG. 2A, there is shown primary-secondary interconnection in PLC circuit 200 showing a primary side (power input) and a secondary side. The interconnection comprises a coupling circuit 201, an analog front end (AFE) 203, digital circuits 205, DC/DC converters 207, power supply secondary circuit 209, a power transformer 211, power supply primary circuit 213, an electromagnetic interference (EMI) filter 215, a zero cross detector 217, and impedance stabilization network (ISN) 219.

The coupling circuit 201 may be operable to receive 50/60 Hz AC power signals that also have one or more higher frequency data signals modulated thereon, and extract the data signals. The coupling circuit 201 may therefore comprise transformers, voltage dividers, and filters, for example.

The analog front end 203 may comprise analog processing circuitry, such as amplifiers, filters, oscillators, and analog-to-digital converters, one or more outputs of which may be coupled to the digital circuits 205 for further processing, but in the digital domain. As such, the digital circuits 205 may comprise one or more processors buffers, memory, and I/O circuitry, for example.

The DC/DC converters 207 may comprise circuitry for receiving one or more DC voltages and generating one or more DC voltages at different voltage levels as needed by other circuitry in the secondary side of the PLC circuit 200. The power supply primary 213 and power supply secondary 209 may comprise circuitry that generates one or more DC voltages from the received AC signals, and may comprise transformers, rectifiers, filters, and voltage dividers, for example. An AC/DC power supply has three parts: primary side, transformer, and secondary side. Primary refers to the side exposed to direct AC contact, while secondary refers to the low-voltage side that can be touched safely. The transformer conveys energy from the primary side to the secondary side magnetically while providing electrical isolation.

The EMI filter 215 may comprise circuitry for filtering out undesired signals resulting from the AC to DC conversion. Accordingly, the EMI filter 215 may comprise active or passive filters comprising transistors, switches, resistors, capacitors, and inductors, for example. The ISN 219 comprises a configurable impedance for providing a controlled impedance to the RF coupling circuit so as to maximize common-mode rejection. The ISN presents a low impedance on the power supply side and a high impedance on the line side, but stable across frequency, and may comprise a low pass filter with low Q, for example. In an example scenario, the earth leg of the ISN 219 has the same series impedance as line and neutral legs, although is it connected to one of those lines on the other side. This causes any leakage noise through the EMI filter 215 and the ISN 219 to be the same on line, neutral and earth. Therefore, the common-mode rejection figure of the transformer is added to the isolation figure of the ISN 219, achieving lower noise in differential mode.

The zero cross detector 217 comprises circuitry for communicating a reduced voltage replica signal of the input power signal VL-VN. Some circuitry in the zero cross detector 217 is shared with the coupling circuit, as shown in FIGS. 3-11.

The circuit shown has seven lines connecting primary and secondary: 2 differential pairs for MIMO 2×2 PLC signal (4 wires), 2 wires for ZCD signal (optocoupler or capacitive divider), 2 wires for DC supply (VCC and GND). This creates the potential for noise loops, being the power supply main noise source. By combining the zero cross detector 217 with the coupling circuit 201, two lines may be saved, as shown in FIGS. 2B and 2D.

In relation to MIMO coupling, part of the differential PLC signal is converted to common mode due to the asymmetry of the AC lines. Sensing the common mode allows increasing data channel capacity with a MIMO 3×2 configuration (3 receivers and 2 transmitters).

Figure 2B:
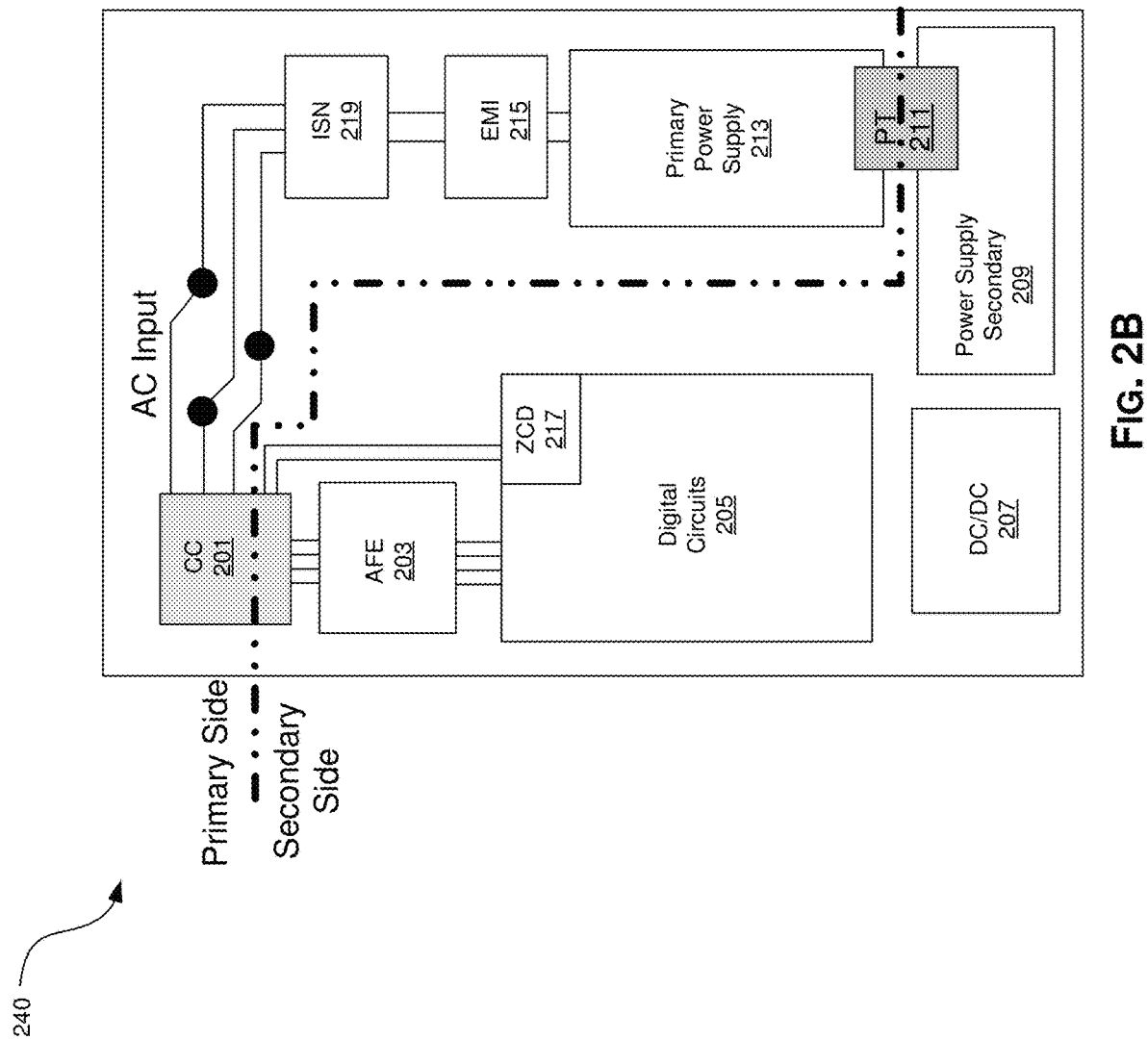
FIG. 2B is a block diagram illustrating an example primary-secondary connection in a power line communication system with combined coupling and zero cross circuitry, which may be used in accordance with various implementations of the disclosure.

FIG. 2B is a block diagram illustrating an example primary-secondary connection in a power line communication system with combined coupling and zero cross circuitry, which may be used in accordance with various implementations of the disclosure. Referring to FIG. 2B, there is shown primary-secondary interconnection in PLC circuit 240 showing a primary side (power input) and a secondary side. The interconnection comprises a coupling circuit 201, an analog front end (AFE) 203, digital circuits 205, DC/DC converters 207, power supply secondary circuit 209, a power transformer 211, power supply primary circuit 213, an electromagnetic interference (EMI) filter 215, a zero cross detector 217, and impedance stabilization network (ISN) 219.

In this example, the zero cross detection 217 is integrated with the digital circuits 205 with signals received from the coupling circuit 201 as opposed to a separate circuit directly coupled to the AC inputs via the ISN 219 as shown in FIG. 2A.

Figure 2C:
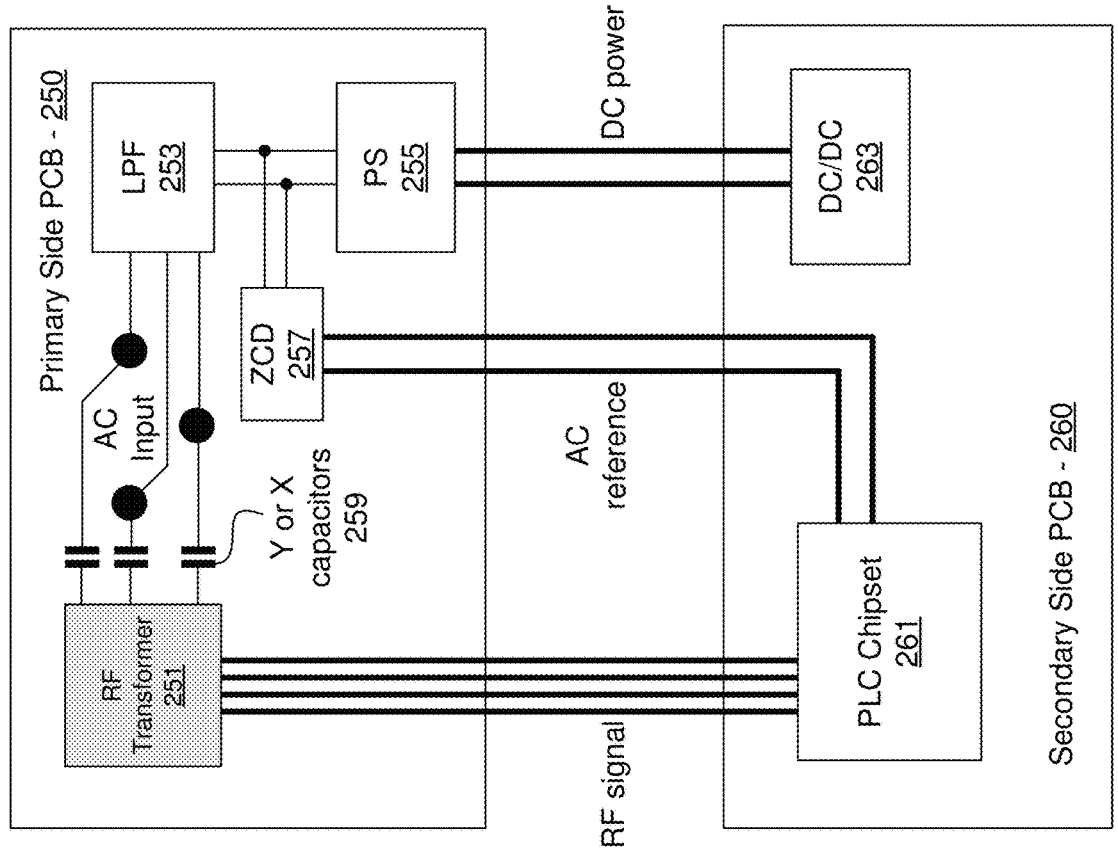
FIG. 2C illustrates the primary and secondary circuitry separation of a power line communication system, which may be used in accordance with various implementations of the disclosure.
Figure 2D:
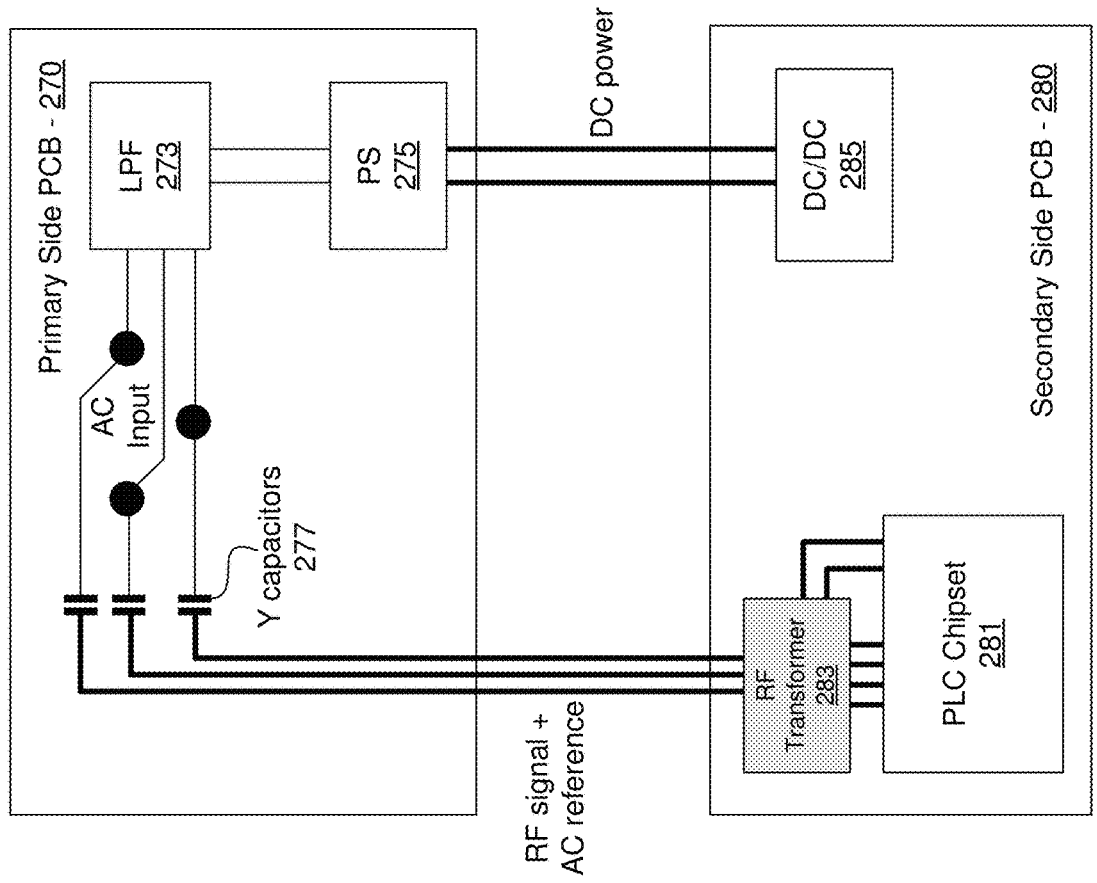
FIG. 2D illustrates another primary and secondary circuitry separation of a power line communication system, which may be used in accordance with various implementations of the disclosure.

FIG. 2C illustrates the primary and secondary circuitry separation of a power line communication system, which may be used in accordance with various implementations of the disclosure. Referring to FIG. 2C, there is shown primary side 250 and secondary side 260 of a powerline communication system. In this example, the primary side 250 comprises RF transformer 251, zero cross detector (ZCD) 257, X or Y capacitors 259, where X or Y indicate the type of capacitors utilized, low pass filter 253, and power supply 255. The secondary side 260 comprises PLC chipset 261 and DC/DC circuitry 263. In this example, eight lines couple the primary and secondary sides, as compared to five lines shown in FIG. 2D.

In this example, RF signals are coupled from the RF transformer 251 via four lines to the PLC chipset 261, the AC reference is coupled to the PLC chipset 261 from the zero cross detector 257 via two lines, and DC power is coupled by two more lines.

FIG. 2D illustrates another primary and secondary circuitry separation of a power line communication system, which may be used in accordance with various implementations of the disclosure. Referring to FIG. 2D, there is shown primary side 270 and secondary side 280 of a powerline communication system. In this example, the primary side 270 comprises Y capacitors 277, where Y indicates the type of capacitors utilized, low pass filter 273, and power supply 275. The secondary side 280 comprises PLC chipset 281, RF transformer 283, and DC/DC circuitry 285. In this example, five lines couple the primary and secondary sides, three for the RF signal and AC reference and two for DC power.

Figure 2E:
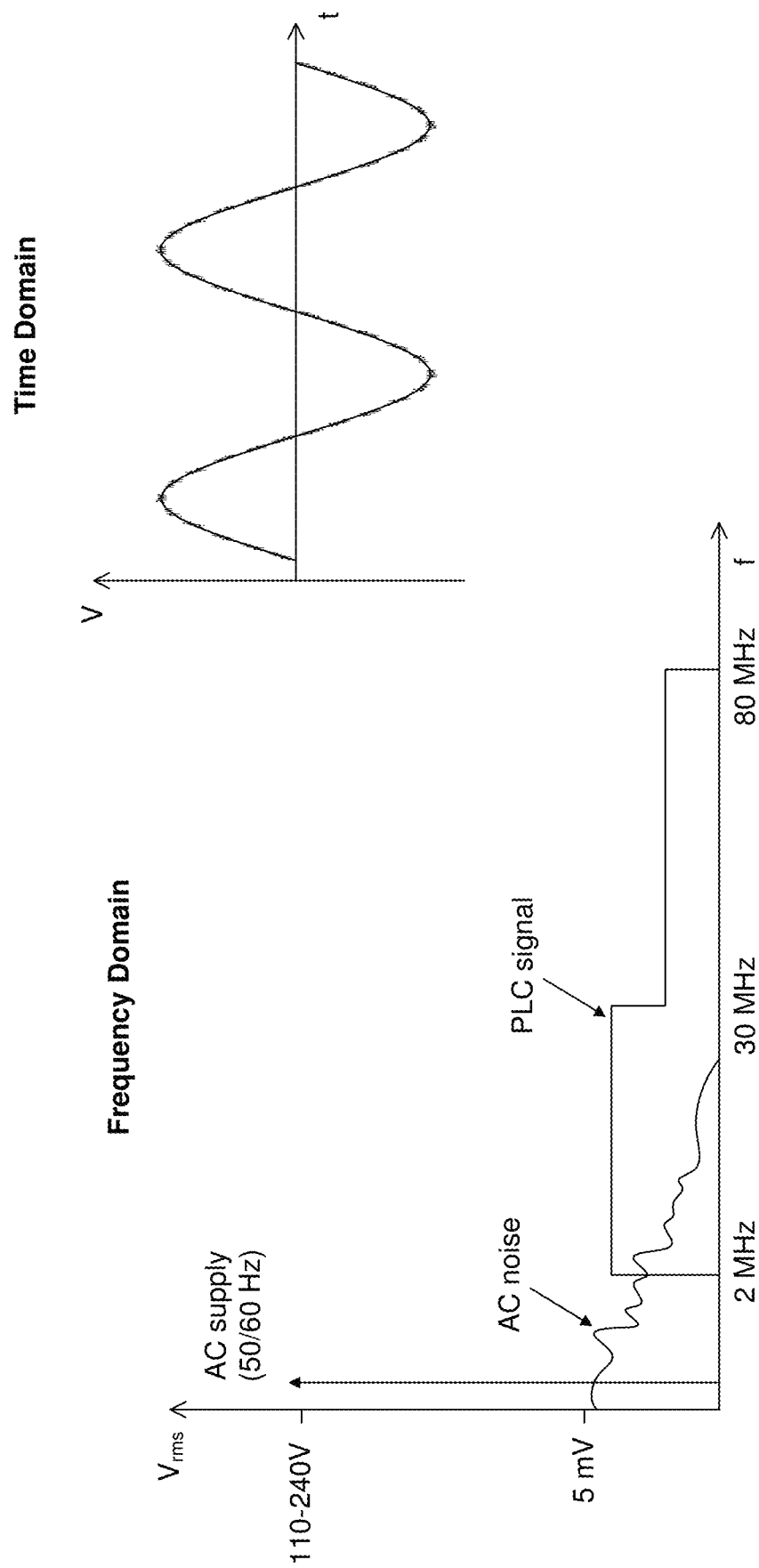
FIG. 2E illustrates frequency and time domain of power and powerline communication signals, in accordance with an example embodiment of the disclosure

FIG. 2E illustrates frequency and time domain of power and powerline communication signals, in accordance with an example embodiment of the disclosure. Referring to FIG. 2E, there is shown a frequency domain plot showing the AC supply signal at 50/60 Hz, its associated noise signals tapering off below 30 MHz, and PLC signals ranging from 2 MHz to 80 MHz. The magnitude of PLC signals is higher in the 2-30 MHz range compared to the 30-80 MHz as the AC noise is more significant in this range. There is also shown a time domain plot of the AC and RF signals.

Figure 3:
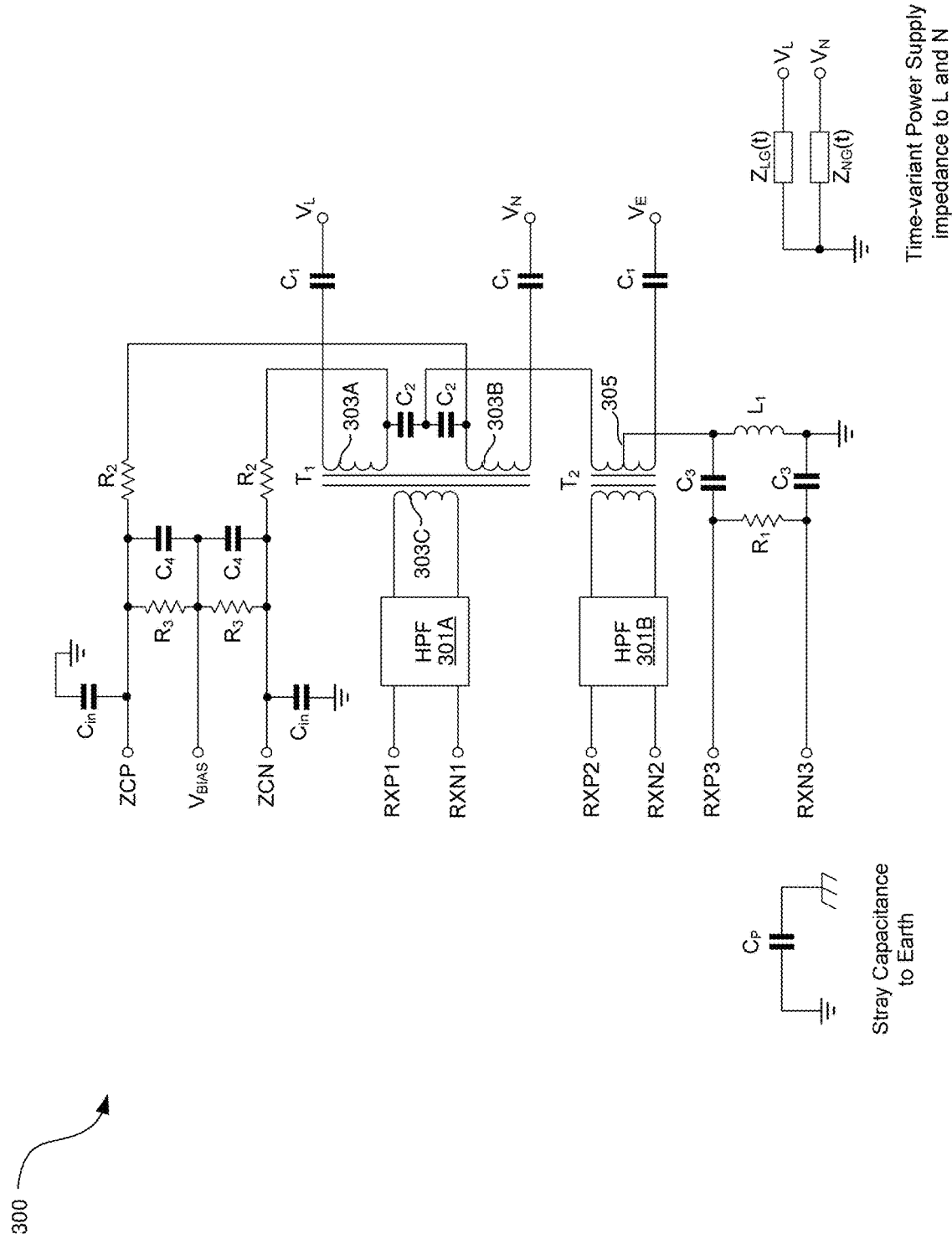
FIG. 3 illustrates a coupling circuit with zero cross detection, which may be used in accordance with various implementations of the disclosure.

FIG. 3 illustrates a coupling circuit with zero cross detection, which may be used in accordance with various implementations of the disclosure. Referring to FIG. 3, there is shown circuitry for receiving input AC voltage at the Line ($V_L$) also referred to as "power" or "hot" line, Neutral ($V_N$), and earth ($V_E$) also referred to as ground. The AC inputs are AC-coupled to the transformers T1 and T2 by capacitors C1, which block most of the AC voltage leaving a small sample of the AC signal for the ZCD 217 and the RF PLC signal with the same magnitude. The transformers T1 and T2 provide electrical isolation and combine the MIMO streams, where transformer T1 comprises primary coils 303A and 303B and a secondary coil 303C, and transformer T2 comprises a center tap 305.

Capacitors C2 form a voltage divider with C1 so that a downscaled version of the AC voltage (1:10 typically) appears across C2. The signal produced by transformer T2 is common-mode for T1 (because it is tapped at the center), and therefore it does not appear on RX1 but it is transmitted on line+neutral relative to earth. Conversely, the signal produced by T1 is not seen by T2 because the center tap is the zero point of a differential signal.

In addition, the capacitors C2 may comprise a voltage divider for providing a common mode voltage to transformer T2, the common mode voltage being orthogonal to the RF signal received at RXP1 and RXN1 via a secondary coil that couples the RF signal via T1 based on input signals $V_L$ and $V_N$. The use of an inductor, such as inductor $L_1$, to set the AC level of the ground plane is utilized even if such inductor is not used to sense the $3^{rd}$ MIMO channel. The same considerations for selecting its value apply.

The outputs of the coupling circuit comprise the zero cross detector outputs ZCP and ZCN, and the PLC signals are output at the RXP1, RXN1, RXP2, RXN2, RXP3, and RXN3 terminals. $C_P$ represents the stray capacitance to earth and the time-varying power supply impedances to Line and Neutral are represented by $Z_{LG}(t)$ and $Z_{NG}(t)$ and may comprise the parasitic capacitance of the PCB to earth plus the explicit capacitance of surge capacitors in the Ethernet port if the system has it. The combined zero cross detection and coupling circuit 300 represents the functions of the coupling circuit 201 and zero cross detection circuit 217 of FIG. 2B. The separate portions and their mathematical backgrounds are described further with respect to FIGS. 4-11.

Figure 4:
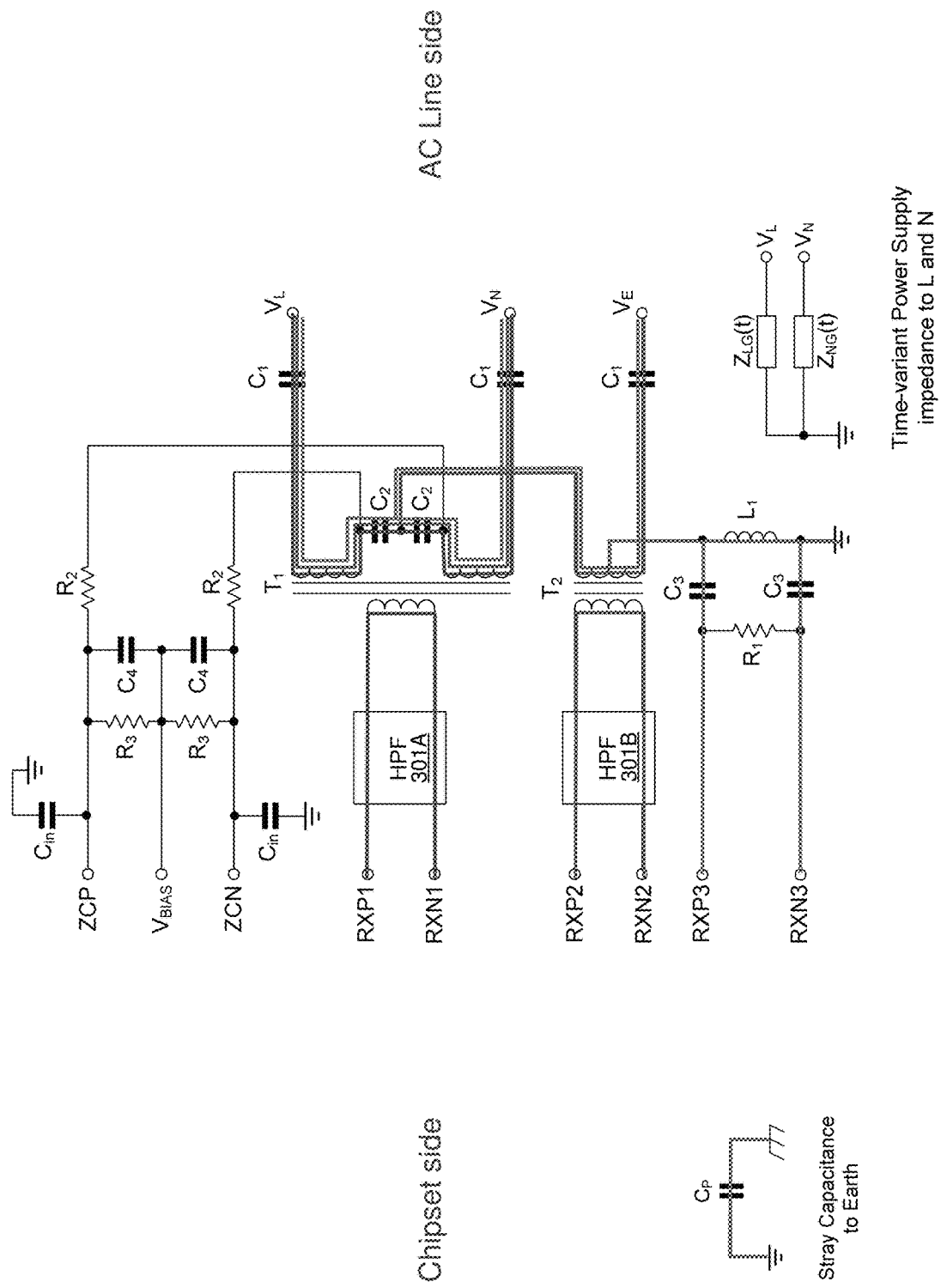
FIG. 4 highlights the RF path of the 3 MIMO streams to the three receiver sections of the coupling circuit with zero cross detection, which may be used in accordance with various implementations of the disclosure.

FIG. 4 highlights the RF path of the 3 MIMO streams to the three receiver sections of the coupling circuit with zero cross detection, which may be used in accordance with various implementations of the disclosure. Referring to FIG. 4, there is shown the circuitry of FIG. 3 but with different PLC signals represented by the different color lines at the Line, Neutral, and Earth inputs as well as in the three receiver sections with outputs RXP1, RXN1, RXP2, RXN2, RXP3, and RXN3.

Figure 5A:
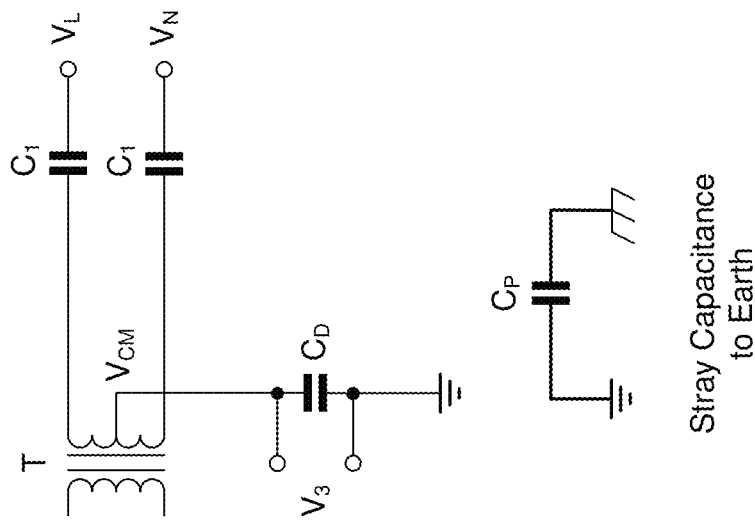
FIGS. 5A and 5B illustrate theoretical and practical representations of a common-mode power line communication receiver, which may be used in accordance with various implementations of the disclosure.
Figure 5B:
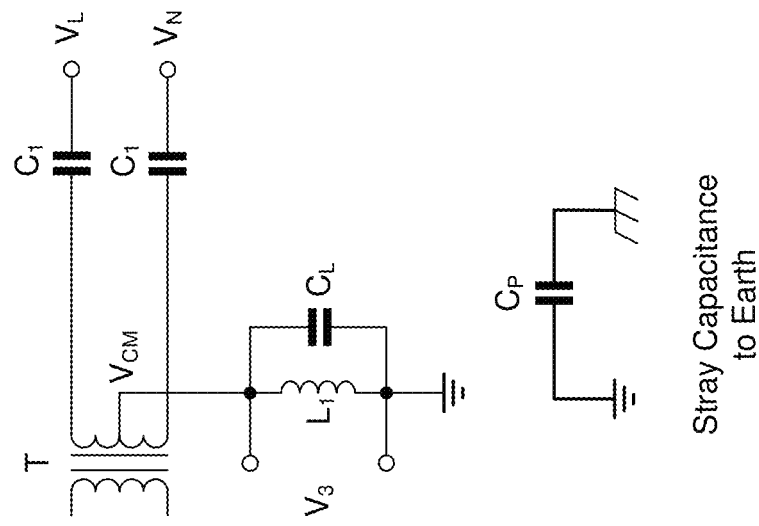

FIGS. 5A and 5B illustrate theoretical and practical representations of a common-mode power line communication receiver, which may be used in accordance with various implementations of the disclosure. Referring to FIG. 5A, there is shown a theoretical representation of a receiver circuit with AC inputs $V_L$ and $V_N$, coupling capacitors $C_1$, capacitor divider based on capacitors $C_D$ and $C_P$, where $C_P$ is the stray capacitance to Earth.

The principle of operation is based on a voltage divider, where one of the impedances is the stray capacitance of the PCB to Earth. The theoretical circuit uses a capacitor divider, where $C_D < C_P$. This option is flat over frequency, and may pick up excessive noise from the power supply and DC/DC converters that is stronger than the signal of interest. An inductor enables the shunting of the low-frequency noise in the kHz band, as shown in the practical circuit schematic in FIG. 5B, while having sufficient impedance in the MHz band to sense the PLC signal. The signal ($V_3$) is sensed in high impedance across the inductor L1. The inductor L1 forms a series LC circuit with the stray capacitance to Earth, and the resonance frequency depends on the stray capacitance $C_P$. In an example scenario, the output voltage $V_3$ increases until the resonance frequency at a rate of 40 dB/decade. Past the resonance frequency, $V_3$ tends to $V_{CM} \cdot C_P/(C_P+C_L)$. Using the right value for inductor L1, $V_3$ is almost the same as $V_{CM}$.

Figure 6:
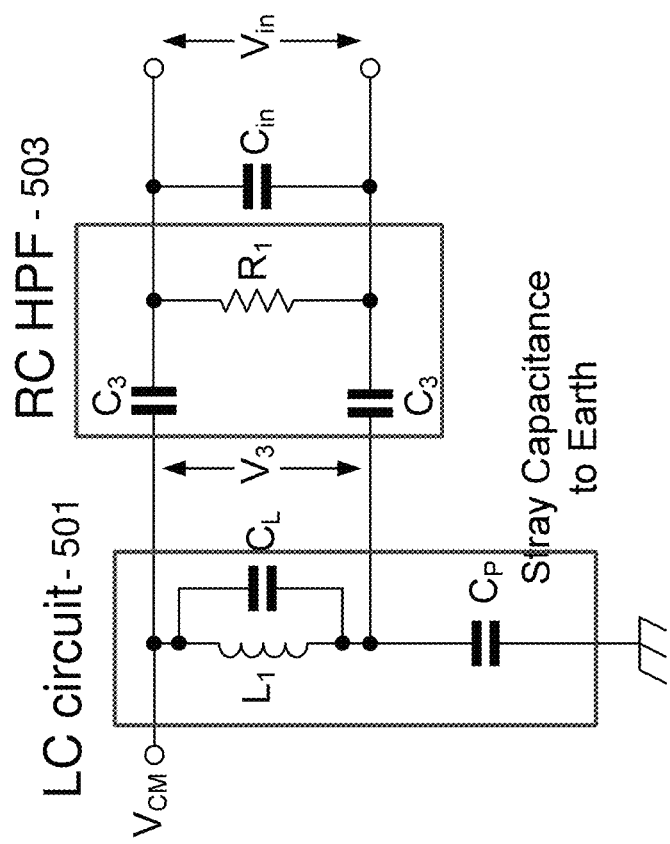
FIG. 6 illustrates a power line communication common-mode receiver, which may be used in accordance with various implementations of the disclosure.

FIG. 6 illustrates a power line communication common-mode receiver, which may be used in accordance with various implementations of the disclosure. Referring to FIG. 6, there is shown a common-mode receiver with an LC circuit 501 and RC high-pass filter 503. The voltage $V_3$ represents the voltage across the inductor $L_1$ and capacitor $C_L$, the parasitic capacitance of inductor $L_1$, based on the input common mode voltage $V_{CM}$ and the stray capacitance to Earth.

Since the resonance frequency depends on the stray capacitance $C_P$, an additional RC high pass filter 503 is utilized as shown in FIG. 6. The highest stray capacitance to Earth is obtained when an Ethernet cable is plugged into the device, due to the EMC capacitor connecting the center tap of the transformer to chassis. An RC high pass filter with high impedance is implemented using capacitors C3 and resistance R1.

Figure 7:
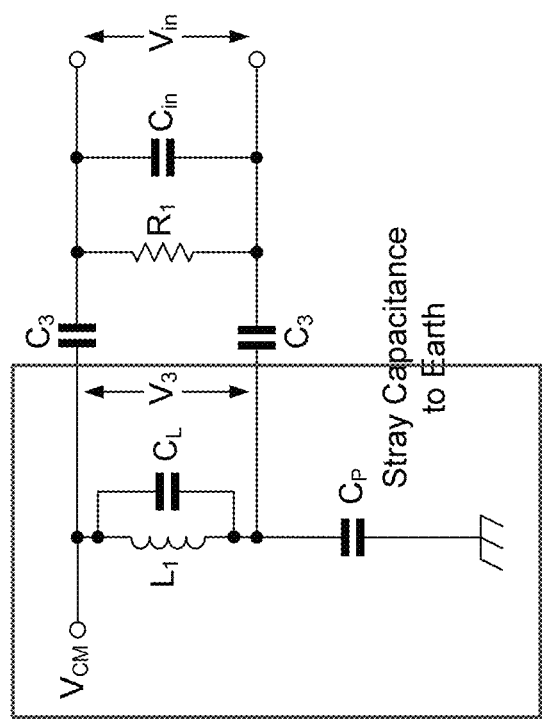
FIG. 7 illustrates a circuit schematic utilized to calculate receiver response, which may be used in accordance with various implementations of the disclosure.

FIG. 7 illustrates a circuit schematic utilized to calculate receiver response, which may be used in accordance with various implementations of the disclosure. Referring to FIG. 7, a separate analysis of the LC branch (formed by $L_1$ and $C_P$) and the HPF filter (formed by $C_3$ and $R_1$) is possible because the RC circuit presents high impedance, the first portion calculated as indicated by the boxed portion of the circuit.

$$V_3 = \frac{C_P L_1 \omega^2}{(C_P + C_L) L_1 \omega^2 - 1}$$

In an example scenario, the LC branch comprising $L_1$ and $C_L$ may attenuate 40 dB/decade below the resonance frequency. With the right inductor (small $C_L$), $V_3$ is almost $V_{CM}$ past the resonance frequency. At 0 Hz, $V_3=0$ $$\lim_{\omega \to 0} \frac{C_P L_1 \omega^2}{(C_P + C_L) L_1 \omega^2 - 1} = 0$$

At high frequency, $V_3$ tends to $$\lim_{\omega \to \infty} \frac{C_P L_1 \omega^2}{(C_P + C_L) L_1 \omega^2 - 1} = \frac{C_P}{C_P + C_L}$$

The resonance frequency is between 2 and 5 MHz for a 10 pH inductor and the expected stray capacitance to Earth of 100 pF to 500 pF. The resonance frequency may be defined as $$f_{res} = \frac{1}{2\pi \sqrt{(C_P + C_L) L_1}}$$

The inductor selected is large enough to produce a voltage drop in the band of interest, but small enough to attenuate the low frequency noise. The inductor selected is also large enough to have the transformer floating in the PLC band so as to avoid ground noise injection in the other MIMO channels. An example value to reject noise in the $3^{rd}$ channel is 1 pH and an example value to reject noise in channels 1 and 2 is 100 pH, but large inductors in high-impedance circuits suffer magnetic field interference, so a tradeoff value is 10 pH.

Figure 8:
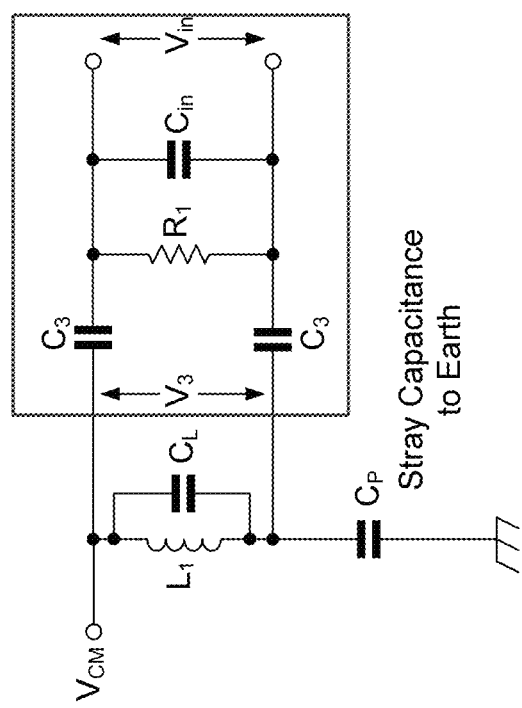
FIG. 8 illustrates a circuit schematic utilized to calculate receiver response, which may be used in accordance with various implementations of the disclosure.

FIG. 8 illustrates a circuit schematic utilized to calculate receiver response, which may be used in accordance with various implementations of the disclosure. Referring to FIG. 8, an analysis of the LC branch and RC filter is indicated by the boxed portion of the circuit. The response of this section is:

$$V_{in} = \frac{R_1 C_3 j\omega}{R_1 (C_{in} + C_3) j\omega + 2}$$

At 0 Hz, $V_{in}=0$ $$\lim_{\omega \to 0} \frac{R_1 C_3 j\omega}{R_1 (C_{in} + C_3) j\omega + 2} = 0$$

The filter attenuates 20 dB/decade up to the cutoff frequency, which is calculated as:

$$f_{cut} = \frac{1}{\pi R_1 ((\sqrt{2} - 1) C_3 - C_{in})}$$

At high frequency, $$\lim_{\omega \to \infty} \frac{R_1 C_3 j\omega}{R_1(C_{in} + C_3)j\omega + 2} = \frac{C_3}{C_{in} + C_3}$$

The loss introduced by this filter when $C_3$ is 10 pF and $C_{in}$ is 2 pF is 2 dB at 50 MHz (highest frequency where 3rd channel is used). With $C_3$=10 pF and $C_{in}$=2 pF the cutoff frequency is 15 MHz and the attenuation is 2 dB at 50 MHz. It is important to control trace capacitance. In this scenario, the combination of the LC filter comprising $L_1$ and $C_L$ and the RC filter comprising $R_1$ and $C_3$ creates a slope of 60 dB/decade to attenuate low frequency noise.

Figure 9:
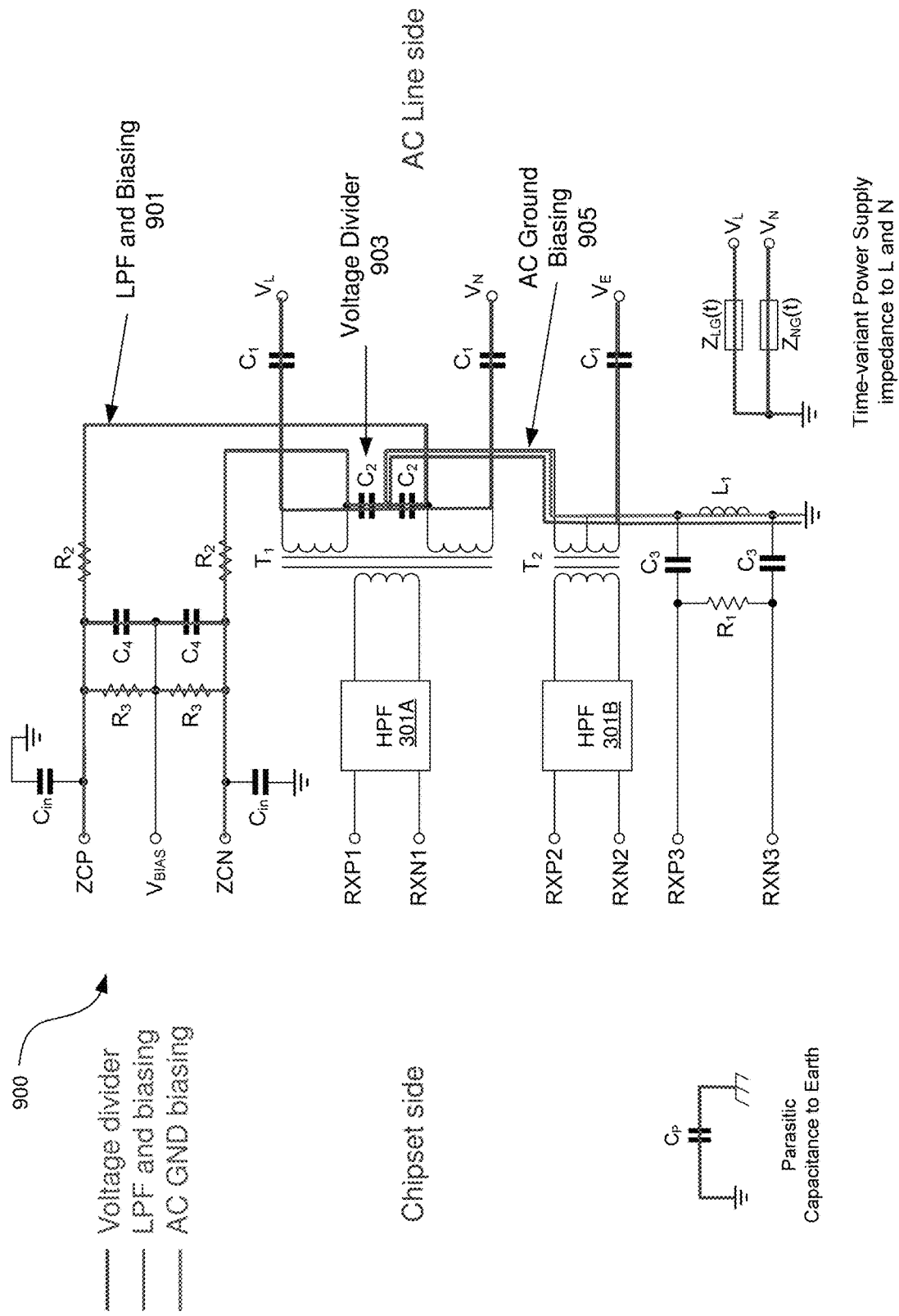
FIG. 9 highlights the zero cross detection portion of the power line communication coupling circuit, which may be used in accordance with various implementations of the disclosure.

FIG. 9 highlights the zero cross detection portion of the power line communication coupling circuit, which may be used in accordance with various implementations of the disclosure. Referring to FIG. 9, the coupling circuit 900 shows the various sections of the zero cross detection circuitry in the power line communication coupling circuit, with low-pass filter and biasing 901, the voltage divider 903, and AC ground biasing portions 905. The combined zero cross detection and coupling circuit 900 represents the functions of the coupling circuit 201 and zero cross detection circuit 217 of FIG. 2. Analysis of this circuitry is described with respect to FIGS. 10 and 11.

Figure 10:
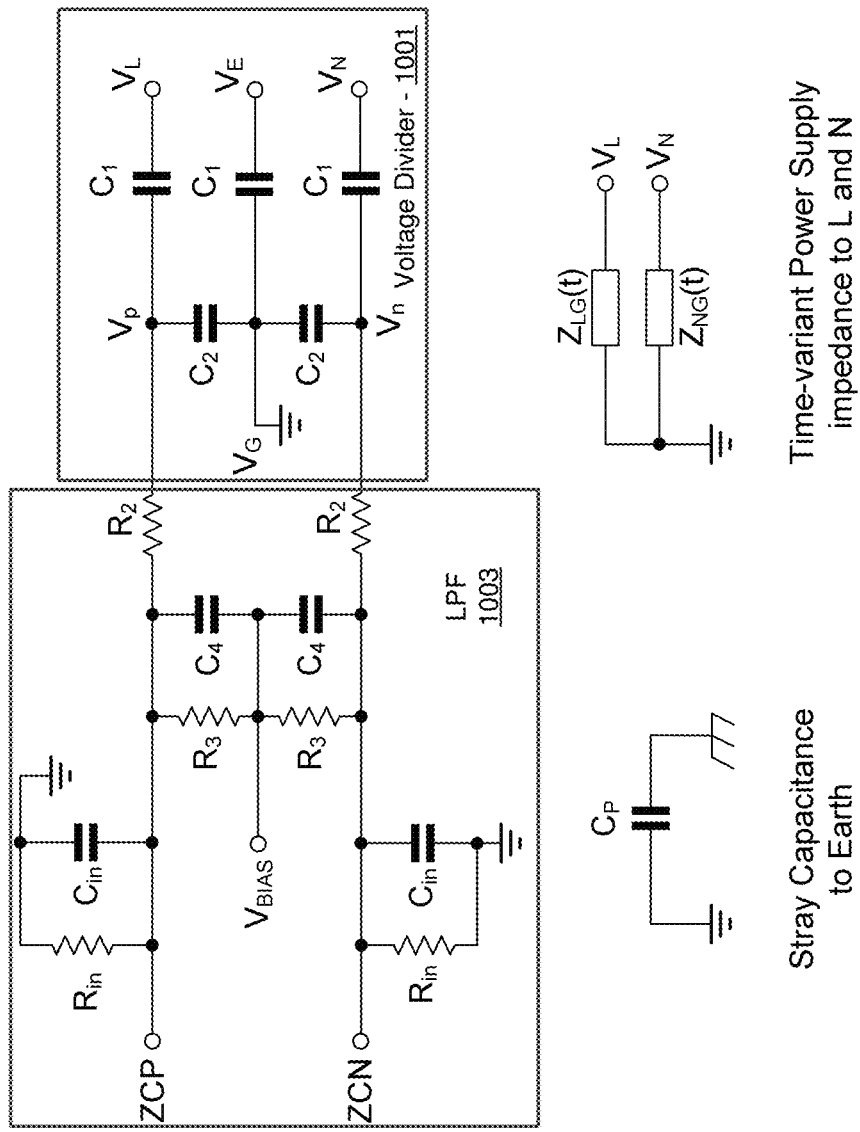
FIG. 10 illustrates a 50/60 Hz equivalent circuit of the zero cross detection portion of the power line communication coupling circuit, which may be used in accordance with various implementations of the disclosure.

FIG. 10 illustrates a 50/60 Hz equivalent circuit of the zero cross detection portion of the power line communication coupling circuit, which may be used in accordance with various implementations of the disclosure. Referring to FIG. 10, there is shown an equivalent circuit for the voltage divider 903 and low-pass filter 901 sections of the zero cross detection circuit. In this scenario, transformers $T_1$ and $T_2$ and inductor $L_1$ are not shown because they are short circuits, thus $V_E = V_N$, and the rest is high impedance.

$C_1$ and $C_2$ form a capacitive voltage divider 1001 to obtain a downscaled version of the AC supply voltage. Resistors $R_2$ and capacitors $C_4$ form a low pass filter 1003 to suppress high frequency noise and harmonics and to prevent any noise leak to the AC line in the PLC band. $R_3$ is used to bias $V_{ZCP}$ and $V_{ZCN}$ in the middle of the comparator supply range; its value is the equivalent of the bias resistors and the input resistance of the comparator in parallel. $C_{in}$ and $R_{in}$ are the input capacitance and resistance of the comparator respectively.

$Z_{LG}(t)$ and $Z_{NG}(t)$ correspond to the impedance of the power supply between ground and line or neutral. This impedance originates from a capacitor bridging the ground and the primary side of the power supply that is used for EMC suppression. The capacitor alternatively connects to line or neutral when the corresponding side of the rectifier bridge is active. This switching introduces a transient effect that affects the amplitude of the downscaled AC signal. It has been verified in simulation that the effect starts after the zero crossing and extinguishes before the next zero crossing. It can be excluded from the AC analysis because it does not affect the phase of the downscaled AC signal.

Capacitors $C_1$, $C_2$ make up a capacitive voltage divider that sets the ground voltage between Line and Neutral. The influence of $C_p$ and the low-pass filter 1003 admittance ($Y_F$) is also computed. $Y_{GN}(t)$ and $Y_{GL}(t)$ are the admittance of the power supply measured between GND, Neutral and Line respectively. This is a transient effect that is not included in AC analysis. It causes a small distortion of the amplitude, but it does not affect the zero crossing point, so is removed in the analysis.

$$\frac{V_{LG}}{V_{GN}} = 1 + \frac{Y_1 + Y_P}{Y_D}$$

$$V_{LN} = V_{LG} + V_{GN}$$

$$Y_D = \frac{Y_1(Y_2 + Y_F)}{Y_1 + Y_2 + Y_F}$$

The voltage difference between L, N and GND is thus:

$$V_{LG} = V_{LN} \cdot \frac{Y_D + Y_1 + Y_P}{2Y_D + Y_1 + Y_P}$$

$$V_{GN} = V_{LN} \cdot \frac{Y_D}{2Y_D + Y_1 + Y_P}$$

Since $C_2 \gg C_1$, $Y_D$ can be simplified as:

$$Y_D = \frac{Y_1(Y_2 + Y_F)}{Y_1 + Y_2 + Y_F} \cong \frac{Y_1(Y_2 + Y_F)}{Y_2 + Y_F} = Y_1$$

The ground plane is biased at around ⅓ the AC supply voltage unless there is an explicit connection to Earth. The voltage of $V_p$ and $V_n$ relative to GND is:

$$V_{pG} = V_{BIAS} + V_{LN} \cdot \frac{Y_1}{Y_2 + Y_F} \cdot \frac{2Y_1 + Y_P}{3Y_1 + Y_P} =$$

$$V_{BIAS} + V_{LN} \cdot \frac{(R_2 + R_3)C_1 j\omega}{1 + (R_2 + R_3)C_2 j\omega} \cdot \frac{2C_1 + C_P}{3C_1 + C_P}$$

$$V_{nG} = V_{BIAS} - V_{LN} \cdot \frac{Y_1}{Y_2 + Y_F} \cdot \frac{Y_1}{3Y_1 + Y_P} =$$

$$V_{BIAS} - V_{LN} \cdot \frac{(R_2 + R_3)C_1 j\omega}{1 + (R_2 + R_3)C_2 j\omega} \cdot \frac{C_1}{3C_1 + C_P}$$

Let $Y_F$ be the admittance of the single-sided low pass filter and input impedance of the chip. It can be assumed that $V_{BIAS}$ is the same net as GND in AC. For simplicity, $C_{in}$ is merged with $C_4$ and $R_{in}$ is merged with $R_3$ by making the corresponding parallel equivalents. The amplitude of $V_{pG}$ and $V_{nG}$ does not exceed the supply rails of the comparator by more than 0.3V (ESD diode drop). The presence of $Y_F$ causes a phase delay of the downscaled signal from the AC voltage. At 50/60 Hz frequency the value of $Y_F$ is mostly real because the admittance of $C_{in}$ and $C_4$ is very small compared to the resistive part, so it can be approximated as:

$$Y_F = \frac{1 + R_3 C_4 j\omega}{(R_2 + R_3) + R_2 R_3 C_4 j\omega}$$

$$Y_F \cong \frac{1}{R_2 + R_3}$$

The effect of $Y_F$ on the capacitive divider formed by $C_1$ and $C_2$ cannot be neglected since its value is in the same order of magnitude as the admittance of $Y_1$. Let $Y_D$ be the admittance of the single-sided circuit between line ($V_L$) or neutral ($V_N$) and the GND plane ($V_G$). This admittance comprises $C_1$, $C_2$ and $Y_F$.

$$Y_D = \frac{Y_1(Y_2 + Y_F)}{Y_1 + Y_2 + Y_F}$$

At AC line frequency (50/60 Hz) $V_N = V_E = 0$ (Earth potential). The Ground plane ($V_G$) of the device is biased at a voltage between Line and Neutral (Earth) as a result of the capacitor divider $C_1$-$C_2$. Let $V_{LG}$ and $V_{GN}$ be the voltage differences from the Line to the Ground plane and from the Ground plane to the Neutral respectively. The above circuit verifies the following two equations:

$$\frac{V_{LG}}{V_{GN}} = 1 + \frac{Y_1 + Y_P}{Y_D}$$

$$V_{LN} = V_{LG} + V_{GN}$$

Solving for $V_{LG}$ and $V_{LN}$, $$V_{LG} = V_{LN} \cdot \frac{Y_D + Y_1 + Y_P}{2Y_D + Y_1 + Y_P}$$

$$V_{GN} = V_{LN} \cdot \frac{Y_D}{2Y_D + Y_1 + Y_P}$$

$V_{pG}$ and $V_{nG}$ are downscaled version of $V_{LG}$ and $V_{GN}$ respectively with a DC bias:

$$V_{pG} = V_{BIAS} + V_{LG} \cdot \frac{Y_D}{Y_2 + Y_F}$$

$$V_{nG} = V_{BIAS} - V_{GN} \cdot \frac{Y_D}{Y_2 + Y_F}$$

Note the negative sign in the second expression because $V_{nG}$ voltage is considered in opposite direction as $V_{GN}$. Expressing $V_{pG}$ and $V_{nG}$ as a function of $V_{LN}$:

$$V_{pG} = V_{BIAS} + V_{LN} \cdot \frac{Y_D}{Y_2 + Y_F} \cdot \frac{Y_D + Y_1 + Y_P}{2Y_D + Y_1 + Y_P}$$

$$V_{nG} = V_{BIAS} - V_{LN} \cdot \frac{Y_D}{Y_2 + Y_F} \cdot \frac{Y_D}{2Y_D + Y_1 + Y_P}$$

An explicit form of $V_{pG}$ and $V_{nG}$ is utilized to calculate the phase of these signals and to ensure that they are always positive. Before engaging the simplification of the expressions, it should be noted that the differential signal ($V_{pG}$-$V_{nG}$) that drives the comparator has a much simpler expression. The downscaled differential signal is $V_{pG}$-$V_{nG}$.

$$V_{pG} - V_{nG} = V_{LN} \cdot \frac{Y_D}{Y_2 + Y_F} = V_{LN} \cdot \frac{Y_1}{Y_1 + Y_2 + Y_F}$$

However this expression still has a phase term that should be analyzed carefully. Knowing that $Y_F$ is essentially real at AC supply frequency, the phase of the signal is configured to be as small as possible:

$$\angle V_{pG} - V_{nG} = \frac{\pi}{2} - \tan^{-1}((R_2 + R_3) \cdot (C_1 + C_2) \cdot 2\pi f)$$

This holds true if the matching of component values is accurate. However $C_1$ and $C_2$ have limitations in tolerance that will cause an additional phase and amplitude deviation. The nominal phase shift is calculated in the table shown below.

To calculate $V_{pG}$ and $V_{nG}$ in an analytical way, some simplification is required. In practice $C_2$ is three orders of magnitude larger than $C_1$. This allows neglecting $Y_1$ in the denominator of $Y_D$ and the expression is simplified as:

$$Y_D = \frac{Y_1(Y_2 + Y_F)}{Y_1 + Y_2 + Y_F} \cong \frac{Y_1(Y_2 + Y_F)}{Y_2 + Y_F} = Y_1$$

Substituting $Y_D$ in the expressions of $V_{pG}$ and $V_{nG}$ and expanding the value of the admittances:

$$V_{pG} = V_{BIAS} + V_{LN} \cdot \frac{Y_1}{Y_2 + Y_F} \cdot \frac{2Y_1 + Y_P}{3Y_1 + Y_P} =$$

$$V_{BIAS} + V_{LN} \cdot \frac{(R_2 + R_3)C_1 j\omega}{1 + (R_2 + R_3)C_2 j\omega} \cdot \frac{2C_1 + C_P}{3C_1 + C_P}$$

$$V_{nG} = V_{BIAS} - V_{LN} \cdot \frac{Y_1}{Y_2 + Y_F} \cdot \frac{Y_1}{3Y_1 + Y_P} =$$

$$V_{BIAS} - V_{LN} \cdot \frac{(R_2 + R_3)C_1 j\omega}{1 + (R_2 + R_3)C_2 j\omega} \cdot \frac{C_1}{3C_1 + C_P}$$

The expressions above contain one real term and one complex term that determines the phase of the signal. In the case of $V_{pG}$ and $V_{nG}$, only the amplitude is relevant since the goal is ensuring that they stay within the supply rails of the comparator. Any excess voltage over or under the supply rails causes a current leak through the ESD diodes that alters the AC biasing of the GND plane and consequently the point of zero crossing.

The peak value of the modulus of $V_{pG}$ and $V_{nG}$ must not exceed 1.8V (1.5V rail voltage+0.3V ESD diode drop) and should not go under −0.3V. The table below shows the voltage in these lines in the corner cases. In some products the GND plane is connected to protective earth. This is equivalent to having a large $C_p$ value.

Calculations using these formulas match simulations:

| f (Hz) | $V_{LN}$ (RMS) | $C_P$ (nF) | $V_{pG}$ (pk) | $V_{nG}$ (pk) | $V_{ZCP}$ (max) | $V_{ZCP}$ (min) | $V_{ZCN}$ (max) | $V_{ZCN}$ (min) | $V_{ZCP}$-$V_{ZCN}$ (pp) | Phase (deg) | Delay (μs) |
|---|---|---|---|---|---|---|---|---|---|---|---|
| 50 | 240 | 0.1 | 0.502 | 0.245 | 1.25 | 0.25 | 1.00 | 0.5 | 0.747 | 0.21 | 11.94 |
| 50 | 240 | 1 | 0.531 | 0.216 | 1.28 | 0.22 | 0.97 | 0.53 | 0.747 | 0.21 | 11.94 |
| 50 | 240 | $10^9$ | 0.747 | 0.000 | 1.50 | 0.00 | 0.75 | 0.75 | 0.747 | 0.21 | 11.94 |
| 60 | 90 | 0.1 | 0.188 | 0.092 | 0.94 | 0.56 | 0.84 | 0.66 | 0.280 | 0.18 | 8.29 |
| 60 | 90 | 1 | 0.199 | 0.081 | 0.95 | 0.55 | 0.83 | 0.67 | 0.280 | 0.18 | 8.29 |
| 60 | 90 | $1^{09}$ | 0.280 | 0.000 | 1.03 | 0.47 | 0.75 | 0.75 | 0.280 | 0.18 | 8.29 |

$C_1$ and $C_2$ are chosen such that the downscaled signal is on the order of 0.75V peak for 240V AC, but there are additional constraints. $C_1$ are Y1 safety capacitors and their value needs to be large enough to avoid attenuating the PLC signal. On the other hand, Y1 capacitors grow quickly in size with capacitance. An example value for $C_1$ is 2.2 nF, which means that C2 must be around 1 µF. There are no ceramic NPO capacitors with 1 µF value, which means that other dielectrics with higher tolerance and voltage sensitivity are used. Tolerance is an issue since it imbalances the single ended voltage of the downscaled signal. Voltage sensitivity is less of an issue because the system can afford some deformation of the sinusoidal signal near the crest as long as the accuracy of the zero crossing point is preserved.

The $R_3$ biasing resistors are also a trade-off between setting the correct DC value and minimizing the phase shift of the downscaled signal. The DC input resistance of the comparator is 5.12 MΩ in an example device, therefore the biasing resistors are at least an order of magnitude lower to ensure that the comparator does not alter the DC biasing level. However biasing resistors in the range of 100 kΩ are not realistic because the delay would be too high (the limit required by G.hn is 50 µs). The design should have enough room to accommodate the delay dispersion due to the poor tolerance of $C_1$ and $C_2$, therefore it is desirable to have a low nominal delay. The alternative is compensating the drop caused by the resistor divider $R_3$-$R_{in}$ by increasing $V_{BIAS}$.

$$V_{BIAS} = 0.75 \cdot \frac{R_{in}}{R_3 + R_{in}}$$

The voltage divider 1001 is followed by a low pass filter 1003 formed by $R_2$, $R_3$, and $C_4$.

$$V_{ZCP} - V_{ZCN} =$$
$$(V_{pG} - V_{nG}) \cdot (1 - Y_F R_2) = (V_{pG} - V_{nG}) \cdot \frac{R_3}{R_2 + R_3 + R_2 R_3 C_4 j\omega}$$

At 50/60 Hz the reactive part is negligible and the transfer function tends to:

$$\lim_{\omega \to 0} (V_{pG} - V_{nG}) \cdot \frac{R_3}{R_2 + R_3 + R_2 R_3 C_4 j\omega} = (V_{pG} - V_{nG}) \cdot \frac{R_3}{R_2 + R_3}$$

Figure 11:
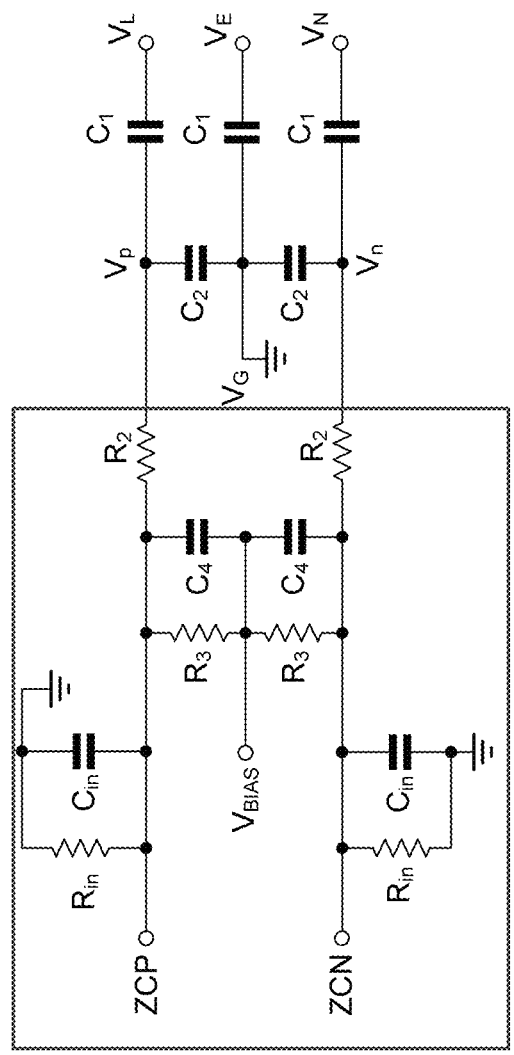
FIG. 11 illustrates analysis of the low-pass filter section of the zero cross detection circuit, which may be used in accordance with various implementations of the disclosure.

FIG. 11 illustrates analysis of the low-pass filter section of the zero cross detection circuit, which may be used in accordance with various implementations of the disclosure. Referring to FIG. 11, the AC harmonics and PLC signal are present at $V_{pG}$ and $V_{nG}$. An RC low-pass filter formed by $R_2$ and $C_4$ is used to remove undesired signals. The effect of biasing resistors+input resistance ($R_3$) and input capacitance ($C_{in}$) is taken into account:

$$V_{ZCP} - V_{ZCN} =$$
$$(V_{pG} - V_{nG}) \cdot (1 - Y_F R_2) = (V_{pG} - V_{nG}) \cdot \frac{R_3}{R_2 + R_3 + R_2 R_3 C_4 j\omega}$$

In this example scenario, the cutoff frequency is around 300 kHz:

$$f_{cut} = \frac{R_2 + R_3}{2\pi R_2 R_3 C_4}$$

It is also important to ensure that this filter does not affect the phase of the downscaled AC signal. This filter contributes an additional phase offset to the downscaled AC signal:

$$\angle V_{ZCP} - V_{ZCN} = \tan^{-1}\left(\frac{-2\pi f \cdot R_2 R_3 C_4}{R_2 + R_3}\right)$$

The phase at 50/60 Hz is −0.01 degree that corresponds to a 3 µs delay to be added to the 8/12 µs introduced by the capacitive divider. The delay is around 3 µs at 50/60 Hz. For the selection of capacitors $C_1$ and $C_2$, $C_1$ is a $Y_1$ safety capacitor to interface the AC line with the following limitations: high tolerance (20%), high cost per nF, large size vs capacitance, and its value must be large enough to avoid attenuating the PLC signal (>2.2 nF).

Capacitor C2 can be a regular ceramic capacitor, and has the following limitations: a large value to scale AC voltage to a manageable level (>500 nF) and a high tolerance for these values (10% since NPO capacitors not available).

In an example embodiment of the disclosure, a method and system is described for power line communication coupling and zero cross detector combination. The system may comprise a circuit for powerline communication comprising a coupling circuit and zero cross detector, where both are coupled to an input transformer that receives an alternating current (AC) power signal and radio frequency (RF) signals via input capacitors on line and neutral input lines. RF signals may be carried by the line, neutral, and ground (earth) lines. The coupling circuit may comprise a plurality of powerline communication receivers, a first of which receives a first RF signal via a secondary coil of the input transformer and a second of which receives a second RF signal via a center terminal of a capacitor pair coupled to primary coils of the input transformer.

The second receiver may comprise a second transformer, where a center tap of the second transformer may be coupled to ground via an inductor. A third receiver may generate a third RF signal via the inductor. The zero cross detector may comprise a capacitor voltage divider comprising the input capacitors and the capacitor pair, where the capacitor voltage divider generates a reduced voltage version of the AC power signal. The zero cross detector may comprise a low pass filter coupled to the capacitor pair that passes the reduced voltage version of the AC power signal but filters any coupled RF signals. The second RF signal may be orthogonal to the first RF signal. The first and second receivers each may comprise a high pass filter that passes RF signals but filters any AC noise signal below the PLC band coupled to the first and second receivers. An analog front end may receive the first and second RF signals, digitize them, and communicate the resulting digital signals to digital circuitry for processing. The zero cross detector may output a signal to the digital circuitry.

In an example embodiment of the disclosure, a method and system is described for MIMO power line communication signal coupling combined with zero cross detector analog front end. The system may comprise a circuit for powerline communication comprising: an input transformer for receiving an alternating current (AC) power signal and radio frequency (RF) signals via input capacitors on line and neutral input lines. RF signals may be carried by the line, neutral, and ground(earth) lines. The circuit may also comprise a coupling circuit comprising a plurality of powerline communication receivers coupled to the input transformer. A first receiver of the plurality of powerline communication receivers may be operable to receive a first RF signal via a secondary coil of the input transformer and a second receiver of the plurality of powerline communication receivers may be operable to receive a second RF signal via a center terminal of a capacitor pair coupled to primary coils of the input transformer. A zero cross detector may be coupled to primary coils of the input transformer.

One embodiment of the present invention may be implemented as a board level product, application specific integrated circuit (ASIC), or with varying levels integrated on a single chip with other portions of the system as separate components. The degree of integration of the system may primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware. In another example scenario, the PLC baseband chip may comprise a hardware modulator/demodulator with an auxiliary CPU in the same SoC.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for powerline communication, the system comprising:
    a circuit for powerline communication comprising:
        an input transformer for receiving an alternating current (AC) power signal and radio frequency (RF) signals from a power line and from a neutral line via an input capacitor on each line;
        a coupling circuit comprising a plurality of powerline communication receivers physically coupled to the input transformer, a first receiver of the plurality of powerline communication receivers for receiving a first RF signal via a secondary coil of the input transformer and a second receiver of the plurality of powerline communication receivers for receiving a second RF signal via a center terminal of a capacitor pair physically coupled to primary coils of the input transformer; and
        a zero cross detector physically coupled to primary coils of the input transformer.

2. The system of claim 1, wherein the second receiver comprises a second transformer.

3. The system of claim 2, wherein a center tap of the second transformer is coupled to ground via an inductor.

4. The system according to claim 3, wherein a third receiver generates a third RF signal via the inductor.

5. The system of claim 1, wherein the zero cross detector comprises a capacitor voltage divider comprising the input capacitors and the capacitor pair, the capacitor voltage divider for generating a reduced voltage version of the AC power signal.

6. The system of claim 5, wherein the zero cross detector comprises a low pass filter coupled to the capacitor pair that passes the reduced voltage version of the AC power signal but filters any coupled RF signals.

7. The system of claim 1, wherein the second RF signal is orthogonal to the first RF signal.

8. The system of claim 1, wherein the first and second receivers each comprises a high pass filter that passes RF signals but filters any AC noise signal coupled to the first and second receivers.

9. The system of claim 1, comprising an analog front end that receives the first and second RF signals, digitizes them, and communicates the resulting digital signals to digital circuitry for processing.

10. The system of claim 9, wherein the zero cross detector outputs a signal to the digital circuitry.

11. A method, comprising:
    in a circuit for powerline communication comprising:
        an input transformer for receiving an alternating current (AC) power signal and radio frequency (RF) signals from a power line and from a neutral line via an input capacitor on each line;
        a coupling circuit comprising a plurality of powerline communication receivers electronically coupled to the input transformer, a first receiver of the plurality of powerline communication receivers for receiving a first RF signal via a secondary coil of the input transformer and a second receiver of the plurality of powerline communication receivers for receiving a second RF signal via a center terminal of a capacitor pair electronically coupled to primary coils of the input transformer; and
        a zero cross detector electronically coupled to primary coils of the input transformer:
    receiving an alternating current (AC) power signal and radio frequency (RF) signals via the input capacitors;
    receiving a first RF signal in the first receiver of the plurality of powerline communication receivers; and
    receiving a second RF signal in the second receiver of the plurality of powerline communication receivers.

12. The method of claim 11, wherein the second receiver comprises a second transformer.

13. The method of claim 12, wherein a center tap of the second transformer is coupled to ground via an inductor.

14. The method according to claim 13, comprising generating a third RF signal in a third receiver via the inductor.

15. The method of claim 11, wherein the zero cross detector comprises a capacitor voltage divider comprising the input capacitors and the capacitor pair, the capacitor voltage divider for generating a reduced voltage version of the AC power signal.

16. The method of claim 15, wherein the zero cross detector comprises a low pass filter coupled to said capacitor pair that passes the reduced voltage version of the AC power signal but filters any coupled RF signals.

17. The method of claim 11, wherein the second RF signal is orthogonal to the first RF signal.

18. The method of claim 11, wherein the first and second receivers each comprises a high pass filter that passes RF signals but filters any AC power signals coupled to the first and second receivers.

19. The method of claim 11, comprising an analog front end that receives the first and second RF signals, digitizes the RF signals, and communicates the resulting digital signals to digital circuitry for processing, and wherein the zero cross detector outputs a signal to the digital circuitry.

20. A system, comprising:
a circuit for powerline communication comprising:
an input transformer for receiving an alternating current (AC) power signal and radio frequency (RF) signals from a power line and from a neutral line via an input capacitor on each line;
a coupling circuit comprising a plurality of powerline communication receivers physically coupled to the input transformer, a first receiver of the plurality of powerline communication receivers for receiving a first RF signal via a secondary coil of the input transformer and a second receiver of the plurality of powerline communication receivers for receiving a second RF signal via a center terminal of a capacitor pair coupled to primary coils of the input transformer; and
a zero cross detector coupled to primary coils of the input transformer, the zero cross detector for stepping down the AC power signal using the input capacitors and the capacitor pair.

* * * * *